(12) United States Patent
Lei et al.

(10) Patent No.: US 11,018,410 B2
(45) Date of Patent: May 25, 2021

(54) WIRELESS COMMUNICATION MODULE

(71) Applicant: MERRY ELECTRONICS (SHENZHEN) CO., LTD., Guangdong (CN)

(72) Inventors: Chun-Hsiang Lei, Taichung (TW);
Jui-Hsien Chien, Taichung (TW);
Heng-Yi Liao, Taichung (TW);
Shuo-Man Yuan, Taichung (TW)

(73) Assignee: MERRY ELECTRONICS (SHENZHEN) CO., LTD., Guangdong (CN)

( * ) Notice: Subject to any disclaimer, the term of this patent is extended or adjusted under 35 U.S.C. 154(b) by 372 days.

(21) Appl. No.: 16/218,450

(22) Filed: Dec. 12, 2018

(65) Prior Publication Data
US 2020/0153079 A1 May 14, 2020

(30) Foreign Application Priority Data

Nov. 9, 2018 (TW) .................................. 107139954

(51) Int. Cl.
| | |
|---|---|
| *H01Q 1/52* | (2006.01) |
| *H01Q 1/22* | (2006.01) |
| *H05K 1/11* | (2006.01) |
| *H05K 5/00* | (2006.01) |
| *H05K 1/18* | (2006.01) |
| *H05K 1/02* | (2006.01) |

(52) U.S. Cl.
CPC .......... *H01Q 1/2283* (2013.01); *H05K 1/028* (2013.01); *H05K 1/118* (2013.01); *H05K 1/189* (2013.01); *H05K 5/0069* (2013.01)

(58) Field of Classification Search
None
See application file for complete search history.

(56) References Cited

U.S. PATENT DOCUMENTS

| | | | | |
|---|---|---|---|---|
| 7,932,864 | B2* | 4/2011 | Zhu ..................... | H01Q 9/0421 |
| | | | | 343/702 |
| 8,154,470 | B2* | 4/2012 | Chang ................. | H01Q 9/0421 |
| | | | | 343/906 |
| 10,418,687 | B2* | 9/2019 | Mow .................... | H01Q 21/065 |
| 2007/0273602 | A1* | 11/2007 | Zhu ...................... | H04B 1/3838 |
| | | | | 343/841 |
| 2012/0176275 | A1* | 7/2012 | Horisawa ............. | H01Q 9/0421 |
| | | | | 343/700 MS |

(Continued)

*Primary Examiner* — Trinh V Dinh
(74) *Attorney, Agent, or Firm* — CKC & Partners Co., LLC (57) ABSTRACT

A wireless communication module includes a first circuit board, a second circuit board, a chip antenna, an electrical connector and an electrical conductive member. The first circuit board and the second circuit board are electrically connected to each other and arranged in parallel spaced relationship. The chip antenna is located on the first circuit board. The electrical connector is located on the second circuit board and between the first and second circuit boards. The electrical conductive member extends from a metal housing of the electrical connector and has at least a radiation aid portion and a shielding portion. The electrical conductive member and the first circuit board collectively define a hollow space, wherein the electrical connector and the electrical conductive member are electrically connected to the chip antenna to serve as an electromagnetic radiation aid member for the chip antenna.

14 Claims, 5 Drawing Sheets

(56) References Cited

U.S. PATENT DOCUMENTS

2016/0043463 A1\* 2/2016 Nakagawa ............. H01Q 1/243
                                                    343/700 MS
2018/0026341 A1\* 1/2018 Mow ...................... H04B 10/90
                                                    343/702

\* cited by examiner

WIRELESS COMMUNICATION MODULE

CROSS-REFERENCE TO RELATED APPLICATION

This application claims priority to Taiwan Application Serial Number 107139954, filed Nov. 9, 2018 which is herein incorporated by reference in its entirety.

BACKGROUND

Field of Invention

The present disclosure relates to a wireless communication module.

Description of Related Art

A conventional wireless communication module requires a large area of printed circuit board or a solid metal material extending from the printed circuit board to serve as an electromagnetic radiation aid for a chip antenna. However, in wireless consumer electronics, it is often required to miniaturize the product or shrink the printed circuit board, thereby deteriorating the performance of the chip antenna. How to design an antenna radiation aid that meets the demanded performance in a miniaturized electronic product is one of the research directions developed by manufacturers.

SUMMARY

The present invention provides a wireless communication module constructed on a plurality of circuit boards to deal with the needs of the prior art problems.

In one or more embodiments, a wireless communication module includes a first circuit board, a second circuit board, a chip antenna, an electrical connector and an electrical conductive member. The first circuit board and the second circuit board are electrically connected to each other and arranged in parallel spaced relationship. The chip antenna is located on the first circuit board. The electrical connector is located on the second circuit board and between the first and second circuit boards. The electrical conductive member extends from a metal housing of the electrical connector and has at least a radiation aid portion and a shielding portion. The electrical conductive member and the first circuit board collectively define a hollow space, wherein the electrical connector and the electrical conductive member are electrically connected to the chip antenna to serve as an electromagnetic radiation aid member for the chip antenna.

In one or more embodiments, the first circuit board has a length greater than a length of the second circuit board.

In one or more embodiments, the wireless communication module further includes a wireless communication integrated circuit chip located on the first circuit board, and the wireless communication integrated circuit chip and the chip antenna are located on two opposite sides of the first circuit board.

In one or more embodiments, the electrical conductive member is located between the electrical connector and the wireless communication integrated circuit chip.

In one or more embodiments, the wireless communication module further includes a power supply module located on the first circuit board and within the hollow space.

In one or more embodiments, the wireless communication module further includes a flexible circuit board to be electrically connected to edges of the first and second circuit boards.

In one or more embodiments, the edges of the first and second circuit boards, to which the flexible circuit board is connected, are substantially aligned with each other.

In one or more embodiments, the electrical connector is a universal serial bus (USB) connector.

In one or more embodiments, the metal housing of the electrical connector comprises a front open end and a rear end opposite to the front open end.

In one or more embodiments, the radiation aid portion includes two sidewalls interconnected between side edges of the first and second circuit boards and arranged in parallel spaced relationship, and one of the two sidewalls extends from the rear end of the metal housing.

In one or more embodiments, the shielding portion includes a top wall interconnected between the two sidewalls of the radiation aid portion. The top wall, the two sidewalls and the first circuit board collectively define the hollow space.

In one or more embodiments, the electrical conductive member is made from a metal material suitable for welding or has a surface coating suitable for welding.

In one or more embodiments, the metal housing of the electrical connector is spaced from the first circuit board by a gap.

In one or more embodiments, the gap is at least 0.5 millimeter.

In sum, the wireless communication module disclosed herein utilizes a space around the electrical connector to expand the electrical conductive member, and thus enhance the performance of the chip antenna without increasing additional volume. Also the electrical conductive member and the circuit board collectively form a shielding enclosure to shelter from the electromagnetic interference of 2.4 GHz or 2.5 GHz wireless electromagnetic signals. In addition, a unitary-piece formed of the electrical connector and the electrical conductive member could serve as a supporting structure between two circuit boards of the wireless communication module, and no additional supporting structure is required and no cutout on the two circuit boards is required to retain the supporting structure, thereby increasing the space for placing components or routing.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
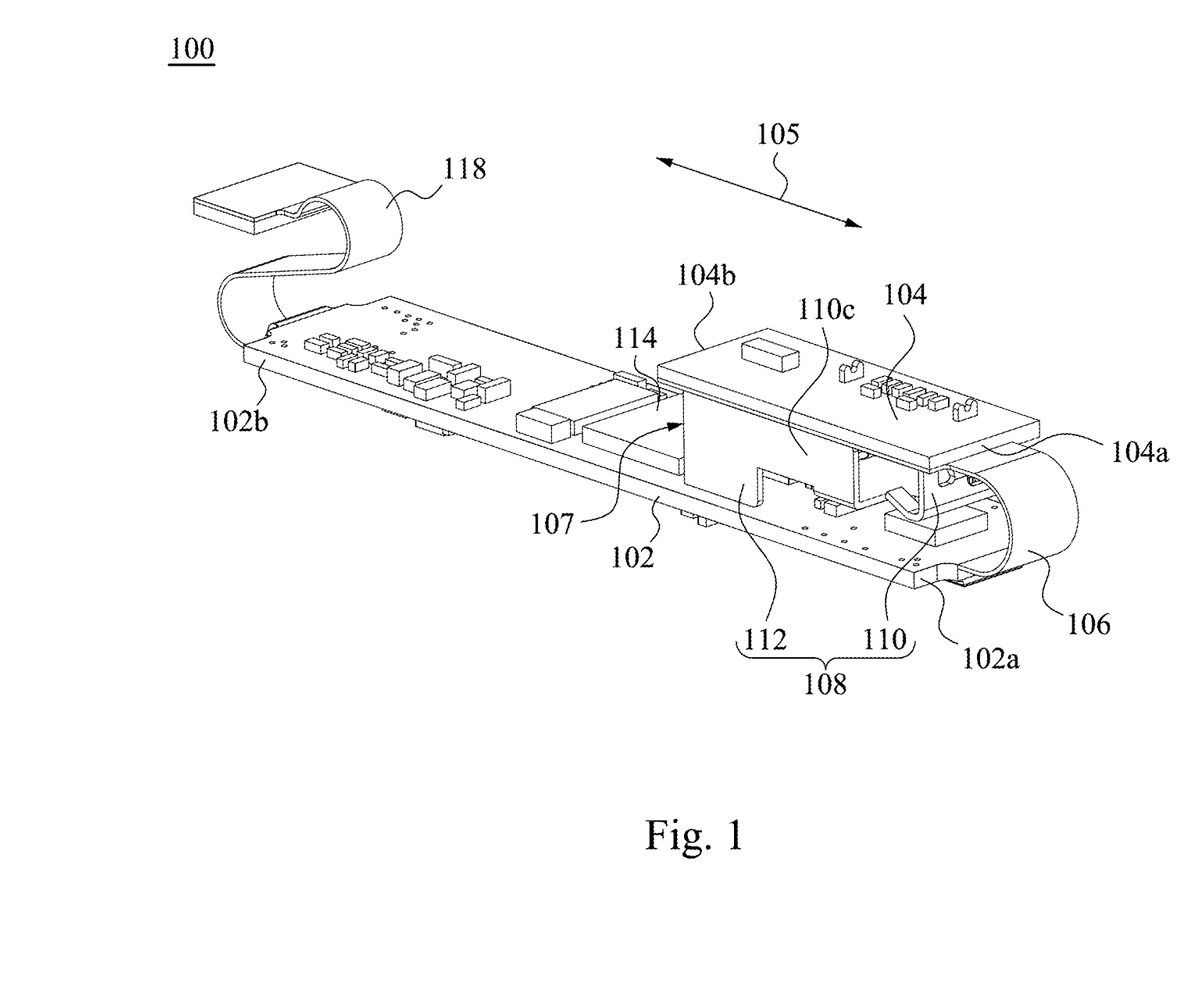
FIG. 1 illustrates a perspective view of a wireless communication module according to one embodiment of the present disclosure.
Figure 2:
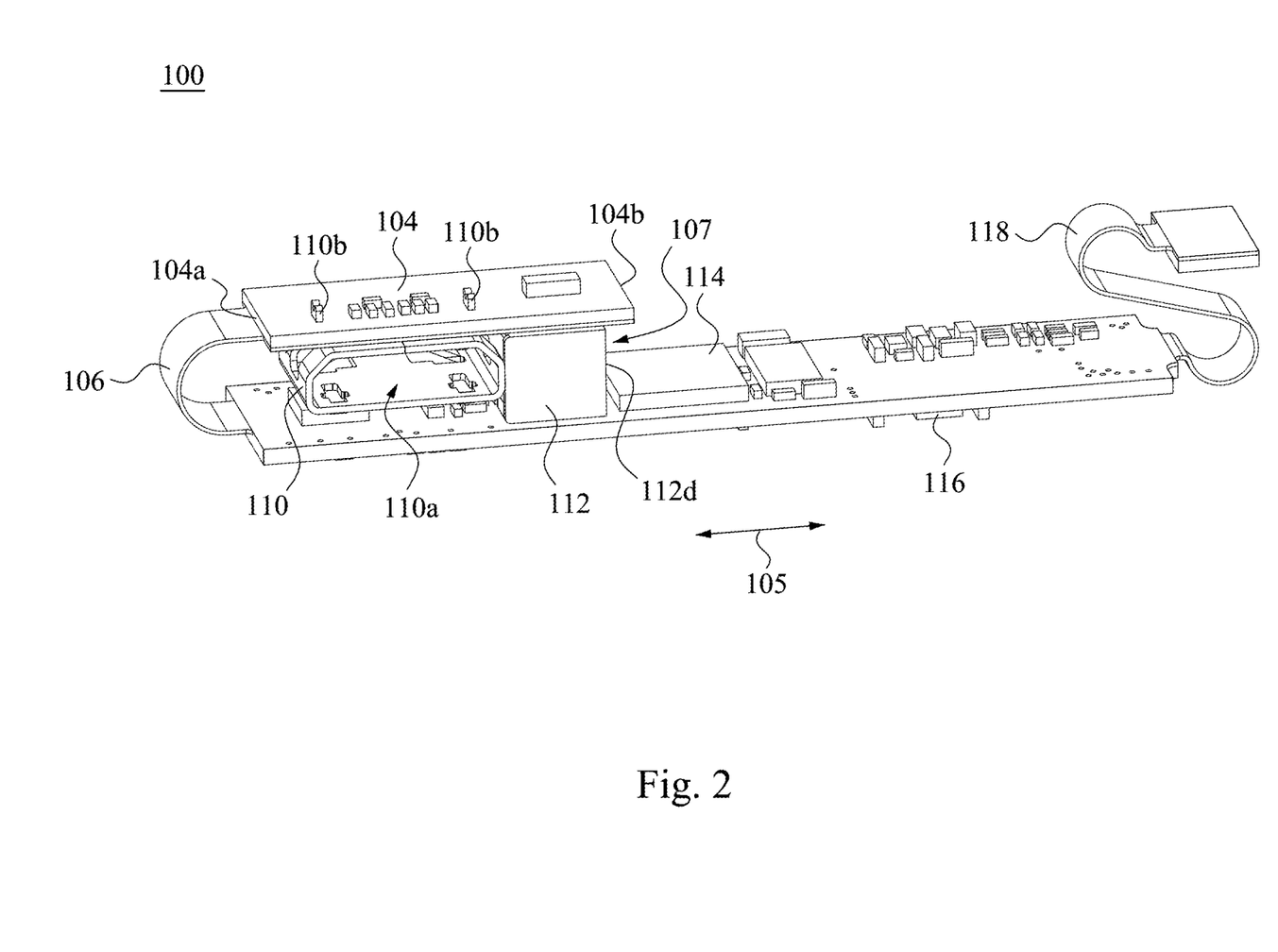
FIG. 2 illustrates a perspective view of the wireless communication module in FIG. 1 from another view point.

Reference is made to FIGS. 1 and 2. FIG. 1 illustrates a perspective view of a wireless communication module 100 according to one embodiment of the present disclosure, and FIG. 2 illustrates a perspective view of the wireless communication module 100 in FIG. 1 from another view point. The wireless communication module 100 is a wireless communication module constructed on a circuit board 102 and a circuit board 104. The circuit board 102 and the circuit board 104 are electrically connected to each other and arranged in parallel spaced relationship. The wireless communication module has a major wireless communication integrated circuit chip 114 and its chip antenna 116 mounted on the circuit board 102. In this embodiment, the wireless communication integrated circuit chip 114 and the chip antenna 116 are mounted on two opposite sides or surfaces of the circuit board 102, but not being limited thereto. For example, the wireless communication integrated circuit chip 114 and the chip antenna 116 may be mounted on the same side or surface of the circuit board 102.

In this embodiment, the circuit board 102 and the circuit board 104 have respective edges electrically connected by a flexible circuit board 106, e.g., the flexible circuit board 106 is interconnected between an end portion 102*a* of the circuit board 102 and an end portion 104*a* of the circuit board 104, and the circuit board 102 has another end portion 102*b* electrically connected to an external system by a connector 118. The end portion 102*a* of the circuit board 102 and the end portion 104*a* of the circuit board 104 may be substantially aligned with each other, but not being limited thereto. In other embodiments, the circuit board 102 and the circuit board 104 have respective edges electrically connected by an electrical connector other than the flexible circuit board, e.g., by a pogo pin connector, but not being limited thereto.

In this embodiment, both the circuit board 102 and the circuit board 104 extend in a lengthwise direction 105, and the circuit board 102 has a length greater than a length of circuit board 104, but not being limited thereto.

The wireless communication module 100 further includes an electromagnetic radiation aid member 108 for the chip antenna 116, and it includes a metal housing of an electrical connector 110 and the electrical conductive member 112. The metal housing of the electrical connector 110 and the electrical conductive member 112 occupy the space between the circuit board 102 and the circuit board 104, thereby occupying no additional volume for the whole wireless communication module. The electrical conductive member 112 extends from the metal housing of the electrical connector 110 (the electrical connector is illustrated in drawings merely by its metal housing, and the details inside the connector are not shown), and includes at least a radiation aid portion 112*e* and a shielding portion 112*d* (referring to FIG. 3). The electrical conductive member 112 and the circuit board 102 collectively wrap around and thus define a hollow space 107 inside thereof. The hollow space 107 may further accommodate additional electronic components to increase component aggregation, but occupy no additional volume for the wireless communication module 100.

In this embodiment, the electrical conductive member 112 is located between the electrical connector 110 and the wireless communication integrated circuit chip 114, but not being limited thereto.

In this embodiment, an end portion of the electrical conductive member 112 does not protrude beyond an end portion 104*b* of the circuit board 104, but not being limited thereto. For example, according to actual demands, the end portion of the electrical conductive member 112 may protrude beyond an end portion 104*b* of the circuit board 104 to effectively achieve a desired performance for the wireless communication module, and occupy not much additional volume.

In this embodiment, the metal housing of the electrical connector 110 has its pins 110*b* electrically connected to the circuit board 104, which is electrically connected to the circuit board 102 by the flexible circuit board 106. Therefore, the chip antenna 116 is electrically connected to the metal housing of the electrical connector 110 via conductive routes in the circuit boards (102, 104) and the flexible circuit board 106.

Figure 3:
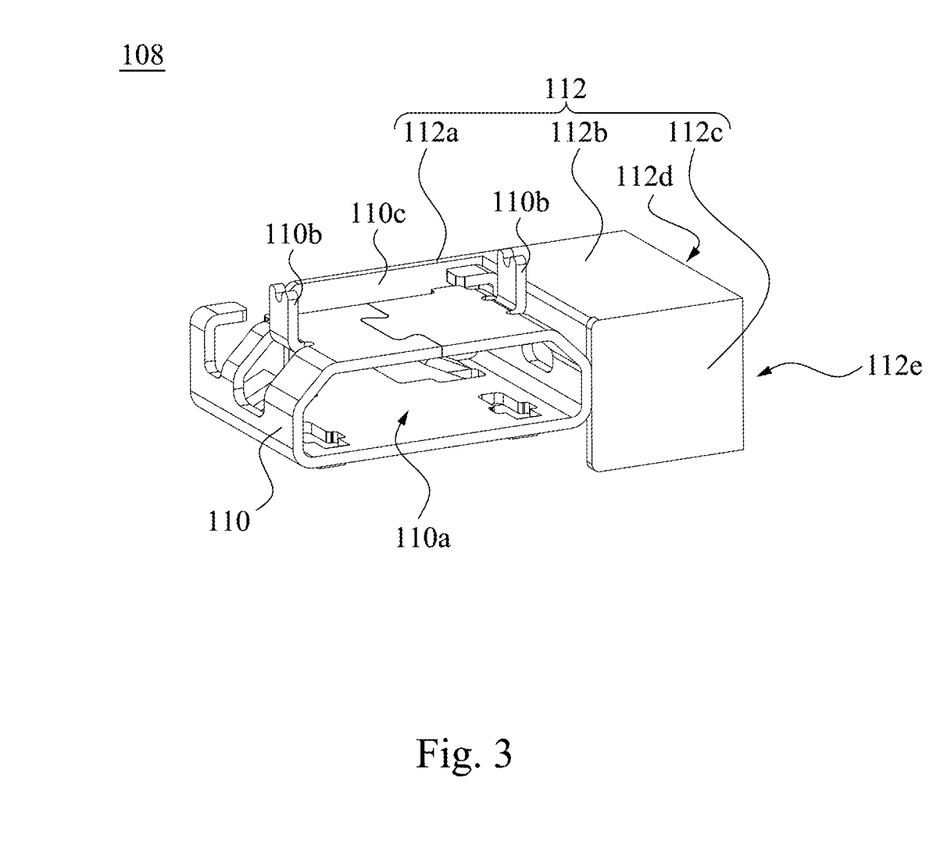
FIG. 3 illustrates a perspective view of an electromagnetic radiation aid member according to one embodiment of the present disclosure.

FIG. 3 illustrates a perspective view of an electromagnetic radiation aid member according to one embodiment of the present disclosure. The electromagnetic radiation aid member 108 includes the metal housing of the electrical connector 110 and the electrical conductive member 112 extending from the metal housing of the electrical connector 110. The metal housing of the electrical connector 110 includes a front open end 110*a* and a rear end 110*c* opposite to the front open end 110*a*. The electrical conductive member 112 is a unitary-piece metal material member extending from the rear end 110*c* of the electrical connector 110. In particular, the electrical conductive member 112 includes two sidewalls (112*a*, 112*c*) in parallel spaced relationship, wherein the sidewall 112*a* extends from the rear end 110*c* of the electrical connector 110.

In this embodiment, the electrical connector 110 is a universal serial bus (USB) connector, but not being limited thereto. When the metal housing of the electrical connector 110 operates as an electromagnetic radiation aid member, i.e., the chip antenna 116 transmits and receives electromagnetic signals through the metal housing of the electrical connector 110, the electrical connector 110 pauses or does not operate as an electrical connector, i.e., the mated connector is not inserted into thereof, so as to avoid electromagnetic interference due to simultaneous execution of two functions. For example, the electrical connector 110 may serve as a power charging connector for the wireless communication module 100. When the wireless communication module 100 needs power charging, a mated connector may be inserted into the electrical connector 110 to perform power charging. After the power charging is completed and the mated connector is removed, the metal housing of the electrical connector 110 may operate as the electromagnetic radiation aid member for the chip antenna 116.

In this embodiment, the electromagnetic radiation aid member 108 is a CNC (Computer Numerical Control) manufactured unitary-piece metal of the electrical connector 110 and the electrical conductive member 112, but not being limited thereto.

Figure 4:
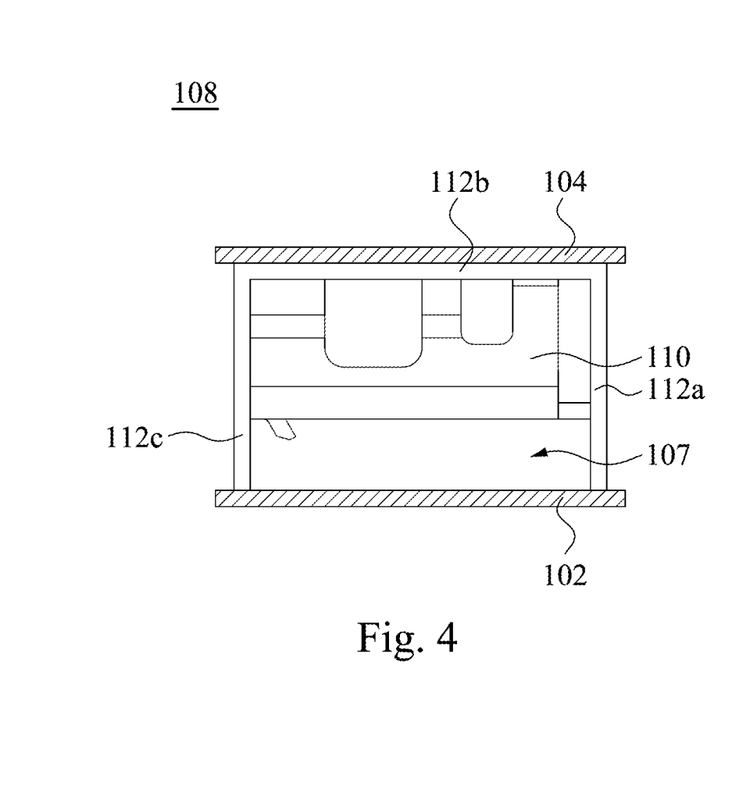
FIG. 4 illustrates a side view of an electrical conductive member according to one embodiment of the present disclosure.

Reference is made to FIG. 4, which illustrates a side view of an electrical conductive member according to one embodiment of the present disclosure. In this embodiment, the electrical conductive member 112 has two sidewalls (112a, 112c) interconnected between side edges of the first and second circuit boards (102, 104) and arranged in parallel spaced relationship. The electrical conductive member 112 also has a top wall 112b interconnected between the two sidewalls (112a, 112c). The two sidewalls (112a, 112c) may operate as a radiation aid portion to enhance the performance of the chip antenna, or operate as a shielding portion to shelter from electromagnetic interference. The top wall 112b may also operate as a radiation aid portion to enhance the performance of the chip antenna, or operate as a shielding portion to shelter from electromagnetic interference.

In this embodiment, the two sidewalls (112a, 112c) of the electrical conductive member 112 may have their bottom edges soldered to the circuit board 102, and the electrical conductive member 112 may include a metal material suitable for welding or a surface coating suitable for welding, but not being limited thereto.

In this embodiment, the two sidewalls (112a, 112c) and the top wall 112b of the electrical conductive member 112 and the circuit board 102 collectively wrap around and thus define the hollow space 107.

Figure 5:
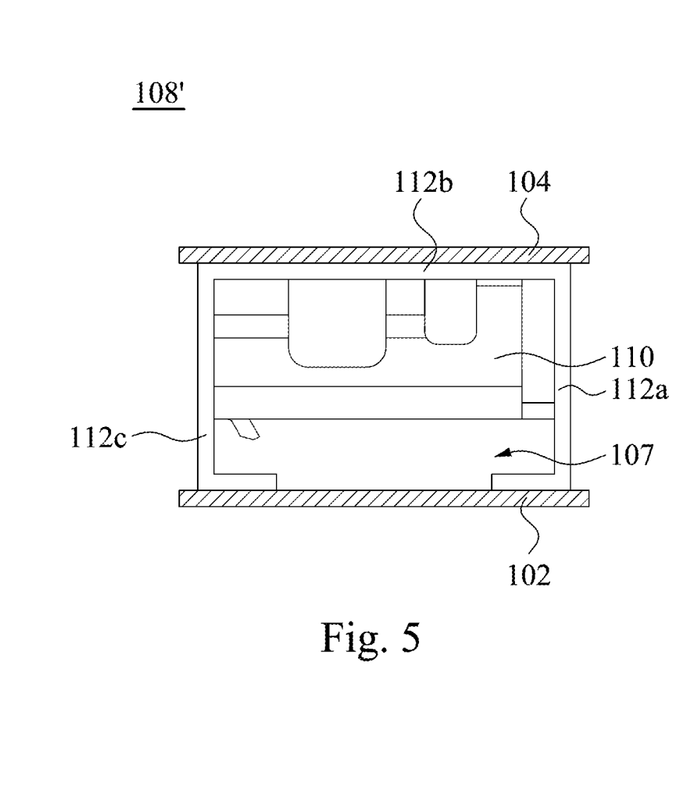
FIG. 5 illustrates a side view of an electrical conductive member according to another embodiment of the present disclosure.

Reference is made to FIG. 5, which illustrates a side view of an electrical conductive member according to another embodiment of the present disclosure. The electromagnetic radiation aid member 108' is different from the electromagnetic radiation aid member 108 in a slightly different shape of the electrical conductive member. In order to reliably solder the electrical conductive member on the circuit board 102, the two sidewalls (112a, 112c) of the electrical conductive member have their bottom edges modified as two symmetrical L-shapes to increase the welding area between the bottom edges and the circuit board. The electrical conductive member is not limited to the structures or shapes in FIG. 4 or FIG. 5, other structures or shapes that can define a hollow space with the circuit board 102, such as a trapezoidal shape, a stepped shape, or a cubic shape, are also applicable, but are not limited thereto.

Figure 6:
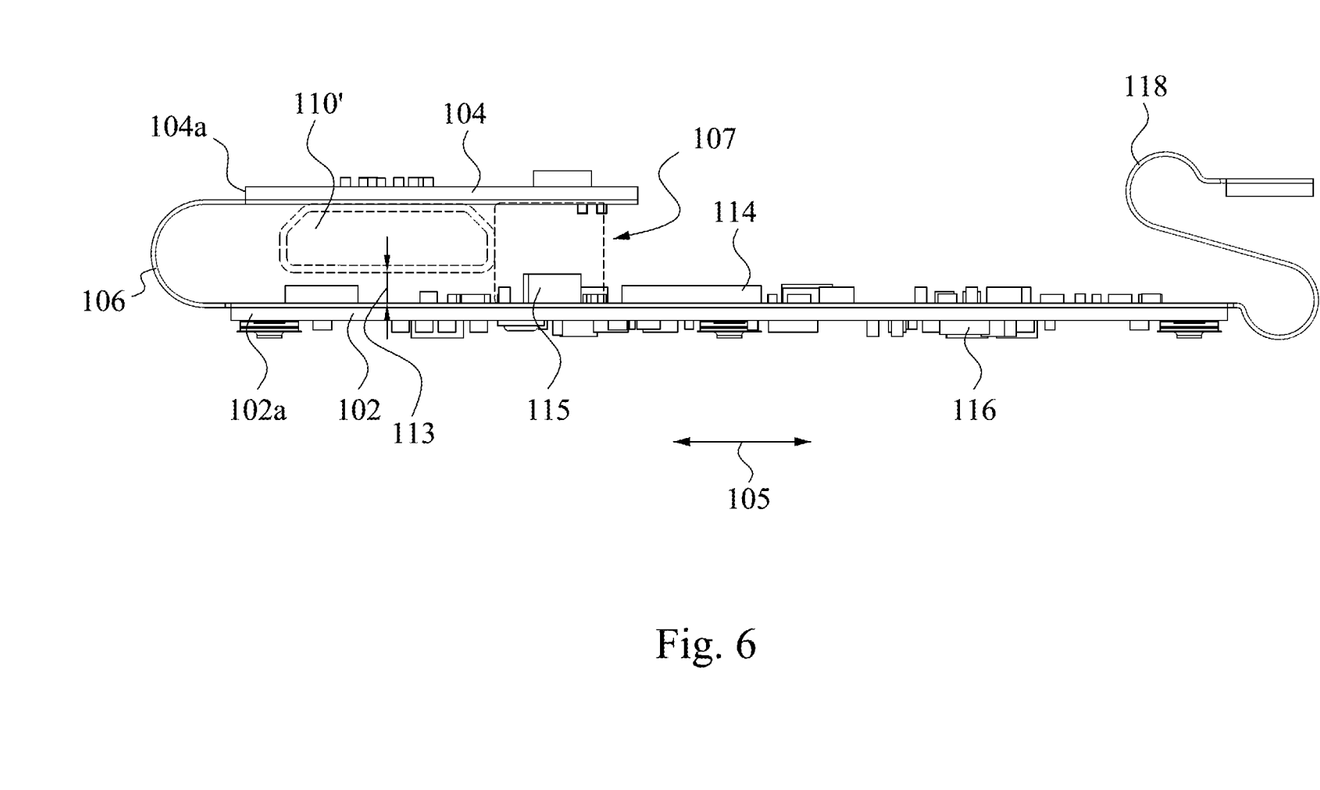
FIG. 6 illustrates a side view of the wireless communication module in FIG. 1 with the electromagnetic radiation aid member removed.

Reference is made to FIG. 6, which illustrates a side view of the wireless communication module in FIG. 1 with the electromagnetic radiation aid member removed. As illustrated in FIG. 6, the hollow space 107 defined by the electrical conductive member 112 and the circuit board 102 may accommodate electrical components, e.g., a power supply module 115 of the wireless communication module, and the electrical conductive member 112 is used to shelter from the electromagnetic interference of 2.4 GHz or 2.5 GHz wireless electromagnetic signals generated by the power supply module 115 within the hollow space 107. In addition, the circuit board 102 is spaced from a space 110' occupied by the electrical connector 110 by a gap 113, and the gap 113 is at least 0.5 millimeter and capable of accommodating additional electrical components.

In sum, the wireless communication module disclosed herein utilizes a space around the electrical connector to expand the electrical conductive member, and thus enhance the performance of the chip antenna without increasing additional volume. Also the electrical conductive member and the circuit board collectively form a shielding enclosure to shelter from the electromagnetic interference of 2.4 GHz or 2.5 GHz wireless electromagnetic signals. In addition, a unitary-piece formed of the electrical connector and the electrical conductive member could serve as a supporting structure between two circuit boards of the wireless communication module, and no additional supporting structure is required and no cutout on the two circuit boards is required to retain the supporting structure, thereby increasing the space for placing components or routing.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A wireless communication module comprising:
a first circuit board and a second circuit board electrically connected to each other and disposed in parallel spaced relationship;
a chip antenna disposed on the first circuit board;
an electrical connector disposed on the second circuit board and between the first and second circuit boards; and
an electrical conductive member extending from a metal housing of the electrical connector and having at least a radiation aid portion and a shielding portion, the electrical conductive member and the first circuit board collectively define a hollow space, wherein the electrical connector and the electrical conductive member are electrically connected to the chip antenna to serve as an electromagnetic radiation aid member for the chip antenna.

2. The wireless communication module of claim 1, wherein the first circuit board has a length greater than a length of the second circuit board.

3. The wireless communication module of claim 1 further comprising a wireless communication integrated circuit chip disposed on the first circuit board, and the wireless communication integrated circuit chip and the chip antenna are disposed on two opposite sides of the first circuit board.

4. The wireless communication module of claim 3, wherein the electrical conductive member is disposed between the electrical connector and the wireless communication integrated circuit chip.

5. The wireless communication module of claim 1 further comprising a power supply module disposed on the first circuit board and within the hollow space.

6. The wireless communication module of claim 1 further comprising a flexible circuit board to be electrically connected to edges of the first and second circuit boards.

7. The wireless communication module of claim 6, wherein the edges of the first and second circuit boards, to which the flexible circuit board is connected, are substantially aligned with each other.

8. The wireless communication module of claim 1, wherein the electrical connector is a universal serial bus (USB) connector.

9. The wireless communication module of claim 1, wherein the metal housing of the electrical connector comprises a front open end and a rear end opposite to the front open end.

10. The wireless communication module of claim 9, wherein the radiation aid portion comprises two sidewalls interconnected between side edges of the first and second circuit boards and disposed in parallel spaced relationship, one of the two sidewalls extends from the rear end of the metal housing.

11. The wireless communication module of claim 10, wherein the shielding portion comprises a top wall interconnected between the two sidewalls of the radiation aid portion, the top wall, the two sidewalls and the first circuit board collectively define the hollow space.

12. The wireless communication module of claim 1, wherein the electrical conductive member comprises a metal material suitable for welding or a surface coating suitable for welding.

13. The wireless communication module of claim 1, wherein the metal housing of the electrical connector is spaced from the first circuit board by a gap.

14. The wireless communication module of claim 13, wherein the gap is at least 0.5 millimeter.

* * * * *